US009760816B1

(12) United States Patent
Williams et al.

(10) Patent No.: US 9,760,816 B1
(45) Date of Patent: Sep. 12, 2017

(54) METAL-CONTAINING TRANSACTION CARDS AND METHODS OF MAKING THE SAME

(71) Applicant: American Express Travel Related Services Company, Inc., New York, NY (US)

(72) Inventors: Troy Patrick Williams, New York, NY (US); Peter Bates, West Newton, MA (US)

(73) Assignee: AMERICAN EXPRESS TRAVEL RELATED SERVICES COMPANY, INC., New York, NY (US)

( * ) Notice: Subject to any disclaimer, the term of this patent is extended or adjusted under 35 U.S.C. 154(b) by 0 days.

(21) Appl. No.: 15/164,609

(22) Filed: May 25, 2016

(51) Int. Cl.
*G06K 19/02* (2006.01)
*C01B 31/06* (2006.01)
*C01G 25/02* (2006.01)
*C01B 31/36* (2006.01)
*C23C 16/513* (2006.01)
*C23C 14/00* (2006.01)

(52) U.S. Cl.
CPC ............ *G06K 19/022* (2013.01); *C01B 31/06* (2013.01); *C01B 31/36* (2013.01); *C01G 25/02* (2013.01); *C23C 14/0021* (2013.01); *C23C 16/513* (2013.01)

(58) Field of Classification Search
USPC ................................................ 235/488, 492
See application file for complete search history.

(56) References Cited

U.S. PATENT DOCUMENTS

| | | | |
|---|---|---|---|
| 5,488,017 A | 1/1996 | Szweda et al. | |
| 8,308,197 B2 | 11/2012 | Peters et al. | |
| 8,725,589 B1 | 5/2014 | Skelding et al. | |
| 2006/0146408 A1* | 7/2006 | Ushiro ................. | G02B 5/1857 359/566 |
| 2007/0285747 A1* | 12/2007 | Matsuura ............ | G03H 1/0011 359/3 |
| 2008/0314995 A1 | 12/2008 | Varga et al. | |
| 2009/0230195 A1* | 9/2009 | Lasch .................... | G06K 19/02 235/488 |
| 2009/0294543 A1* | 12/2009 | Varga ..................... | G06K 19/02 235/492 |
| 2011/0193337 A1* | 8/2011 | Tziovaras ............... | B32B 27/18 283/113 |
| 2012/0141814 A1* | 6/2012 | Petzoldt .................. | C09D 4/00 428/522 |
| 2013/0248607 A1* | 9/2013 | Zlotnik ................. | G06K 19/02 235/488 |
| 2014/0070009 A1 | 3/2014 | Zambrano | |
| 2014/0361086 A1* | 12/2014 | Finn ........................ | B05D 3/06 235/488 |
| 2015/0004377 A1* | 1/2015 | Pudleiner ............... | B32B 27/08 428/195.1 |
| 2015/0069131 A1 | 3/2015 | Scanlon et al. | |
| 2015/0339564 A1 | 11/2015 | Herslow et al. | |

\* cited by examiner

*Primary Examiner* — Allyson Trail
(74) *Attorney, Agent, or Firm* — Snell & Wilmer L.L.P.

(57) ABSTRACT

A transaction card is provided comprising a card body comprising a metallic material, the card body including a primary surface, a secondary surface, an aperture and a slit, wherein the primary surface and the secondary surface are coated with a diamond like carbon (DLC) coating.

16 Claims, 4 Drawing Sheets

METAL-CONTAINING TRANSACTION CARDS AND METHODS OF MAKING THE SAME

FIELD

This disclosure generally relates to metal-containing transaction cards useful for facilitating payments and methods of making the same. The transaction cards may include other features such as a diamond like carbon (DLC) coating, a microchip (e.g., smart card) and one or more antennae.

BACKGROUND

The proliferation of transaction cards (which allow the cardholder to, for example, pay with credit rather than cash) started in the United States in the early 1950s. Initial transaction cards were typically restricted to select restaurants and hotels and were often limited to an exclusive class of individuals. Since the introduction of plastic credit cards, the use of transaction cards have rapidly proliferated from the United States, to Europe, and then to the rest of the world. Transaction cards are not only information carriers and facilitate access to information, but also typically allow a consumer to pay for goods and services, without the need to constantly possess cash. If a consumer needs cash, transaction cards allow access to funds through, for example, an automatic teller machine (ATM). Transaction cards also reduce the exposure to the risk of cash loss through theft and reduce the need for currency exchanges when traveling to various foreign countries. Due to the advantages of transaction cards, hundreds of millions of cards are now produced and issued annually, thereby resulting in a need for companies to differentiate their cards from competitor's cards.

Initially, the transaction cards often included the issuer's name, the cardholder's name, the card number, and the expiration date embossed onto the card. The cards also usually included a signature field on the back of the card for the cardholder to provide a signature to help protect against forgery and tampering. Thus, the cards served as devices to provide data to merchants and the card security included the comparison of the cardholder's signature on the card to the cardholder's signature on a receipt along with the embossed cardholder's name on the card.

Due to the popularity of transaction cards, numerous companies, banks, airlines, trade groups, sporting teams, clubs and other organizations have developed their own transaction cards. As such, many companies continually attempt to differentiate their transaction cards and increase market share, not only by offering more attractive financing rates and low initiation fees, but also by offering unique, aesthetically pleasing features on the transaction cards. As such, many transaction cards include not only demographic and account information, but the transaction cards also include graphic images, designs, photographs and security features.

Administrative and security issues (e.g., charges, credits, merchant settlement, fraud, reimbursements, etc.) have increased due to the increasing use of transaction cards. Thus, the transaction card industry started to develop more sophisticated transaction cards which allowed the electronic reading, transmission, and authorization of transaction card data for a variety of industries. For example, magnetic stripe cards, optical cards, smart cards, and calling cards have been developed to meet the market demand for expanded features, functionality, and security. In addition to the visual data, the incorporation of a magnetic stripe on the back of a transaction card allows digitized data to be stored in machine readable form. As such, magnetic stripe readers are used in conjunction with magnetic stripe cards to read the digitized data (e.g., account information and expiration date), then communicate the digitized data and the purchase data received on-line from a cash register device to a host computer.

Due to the susceptibility of the magnetic stripe to tampering, the lack of confidentiality of the information within the magnetic stripe and the problems associated with the transmission of data to a host computer, integrated circuits were developed which may be incorporated into transaction cards. These integrated circuit (IC) cards, known as smart cards, proved to be very reliable in a variety of industries due to their advanced security and flexibility for future applications. However, even integrated circuit cards are susceptible to counterfeiting.

As magnetic stripe cards and smart cards developed, the market demanded international standards for the cards. The card's physical dimensions, features and embossing area were standardized under the International Standards Organization ("ISO"), ISO 7810 and ISO 7811. The issuer's identification, the location of particular compounds, coding requirements, and recording techniques were standardized in ISO 7812 and ISO 7813, while chip card standards were established in ISO 7813. For example, ISO 7811 defines the standards for the magnetic stripe which is a 0.5 inch stripe located either in the front or rear surface of the card and which is divided into three longitudinally parallel tracks. The first and second tracks hold read-only information with room for 79 alphanumeric characters and 40 numeric characters, respectively. The third track is reserved for financial transactions and includes enciphered versions of the user's personal identification number, country code, currency units, amount authorized per cycle, subsidiary accounts, and restrictions.

More information regarding the features and specifications of transaction cards can be found in, for example, *Smart Cards* by Jose Luis Zoreda and Jose Manuel Oton, 1994; *Smart Card Handbook* by W. Rankl and W. Effing, 1997, and the various ISO standards for transaction cards available from ANSI (American National Standards Institute), 11 West 42nd Street, New York, N.Y. 10036.

The incorporation of machine-readable components onto transactions cards encouraged the proliferation of devices to simplify transactions by automatically reading from and/or writing onto transaction cards. Such devices include, for example, bar code scanners, magnetic stripe readers, point of sale terminals (POS), automated teller machines (ATM) and card-key devices.

Typical transaction cards are made from thermoplastic materials, such as polyvinyl chloride (PVC) and polyethylene terephthalate (PET). However, these transaction cards are susceptible to being damaged or destroyed if exposed to damaging environments. For example, transaction cards may be damaged if left exposed to the elements for an extended period of time. Moisture and/or sunlight may break down the chemical bonds within the polymers of typical transaction cards, such that transaction cards left exposed to moisture and sunlight may become warped, cracked and/or unusable. In addition, thermoplastic transaction cards may be easily bent or may be broken or cut, thereby damaging the transaction card and rendering it unusable.

Therefore, a need exists for a transaction card that has both strength and durability. Moreover, a need exists for a transaction card that withstands exposure to the elements, such as moisture or sunlight.

SUMMARY

In various embodiments, a transaction card is provided comprising a card body comprising a metallic material, the card body including a primary surface, a secondary surface, an aperture and a slit, wherein the primary surface and the secondary surface are coated with a diamond like carbon (DLC) coating.

In various embodiments, a method of making a transaction card comprises fabricating a metallic card body, forming an aperture on a primary surface of the metallic card body, forming a slit in the metallic card body, and coating the metallic card body with a diamond like carbon (DLC) coating.

Additional features and advantages of the present invention are described in, and will be apparent from, the detailed description of the presently preferred embodiments and from the drawings.

DETAILED DESCRIPTION

Figure 1:
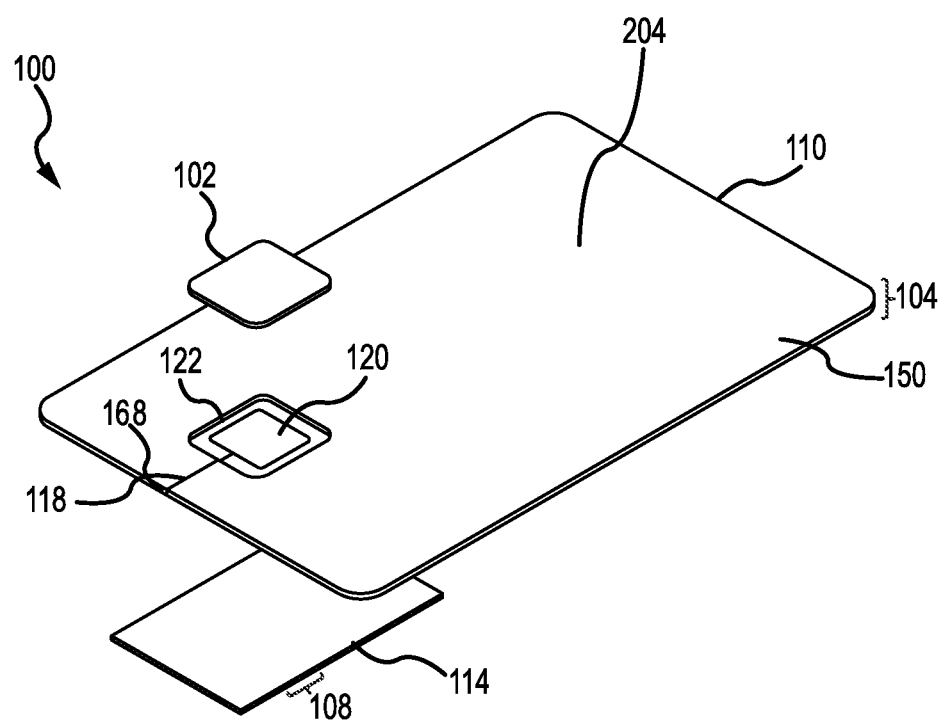
FIG. 1 illustrates an exploded view of a metal-containing transaction card coated with a diamond-like carbon (DLC) coating, in accordance with various embodiments.

The detailed description of exemplary embodiments herein makes reference to the accompanying drawings, which show exemplary embodiments by way of illustration and their best mode. While these exemplary embodiments are described in sufficient detail to enable those skilled in the art to practice the inventions, it should be understood that other embodiments may be realized and that logical, chemical and mechanical changes may be made without departing from the spirit and scope of the disclosure. Thus, the detailed description herein is presented for purposes of illustration only and not of limitation. For example, the steps recited in any of the method or process descriptions may be executed in any order and are not necessarily limited to the order presented.

A transaction card may be a charge card, credit card, debit card, awards card, prepaid card, telephone card, smart card, magnetic stripe card, bar code card, transponder, radio frequency card and/or the like. The transaction card may have an associated account number (e.g., embossed, printed, and/or accessed), which cardholders typically present to merchants or use to interact with a machine, as part of a transaction, such as a purchase.

An "account number", as used herein, includes any device, code, number, letter, symbol, digital certificate, smart chip, digital signal, analog signal, biometric or other identifier/indicia suitably configured to allow the consumer to interact or communicate with the system, such as, for example, authorization/access code, personal identification number (PIN), Internet code, other identification code, and/or the like which is optionally located on card. The account number may be distributed and stored in any form of plastic, ceramic, electronic, magnetic, radio frequency, wireless, audio and/or optical device capable of transmitting or downloading data from itself to a second device. A customer account number may be, for example, a sixteen-digit credit card number, although each credit provider has its own numbering system, such as the fifteen-digit numbering system used by American Express. Each company's credit card numbers comply with that company's standardized format such that the company using a sixteen-digit format will generally use four spaced sets of numbers, as represented by the number "0000 0000 0000 0000". The first five to seven digits are reserved for processing purposes and identify the issuing bank, card type and etc. In this example, the last sixteenth digit is used as a sum check for the sixteen-digit number. The intermediary eight-to-ten digits are used to uniquely identify the customer.

In various embodiments, an account number may identify a consumer. In addition, in various embodiments, a consumer may be identified by a variety of identifiers, including, for example, an email address, a telephone number, a cookie id, a radio frequency identifier (RFID), a biometric, a geographic indicator and/or the like. The card may be associated with, have access to or include a rewards account, charge account, credit account, debit account, prepaid account, telephone card, embossed card, smart card, magnetic stripe card, bar code card, transponder, radio frequency card, key card, access card or an associated account.

Metal-containing transaction cards and methods of making the same are provided herein. In various embodiments, metal-containing transaction cards comprise a metallic card body having a DLC coating on at least one of a primary surface or a secondary suirface. DLC coatings allow for transaction cards that tend to be robust. A metallic card body may also act in concert with an RF transmitter device to improve RF signal distribution.

ISO 7810 stipulates that transaction cards in the "ID-1" format be 85.60 mm in width×53.98 mm in height×0.76 mm in thickness (3.370 in×2.125 in×0.03 in) (as the terms width, height, and thickness are further discussed herein). In various embodiments, metal-containing transaction cards may be standard-sized (i.e., about 3⅜ inches by about 2¼ inches by about 0.03 inches, and/or those dimensions specified in ISO 7810 and ISO 7811, for example, for an "ID-1" card) or any other size specified in ISO 7810 and ISO 7811 or any other size or configuration still usable as a transaction card or configured to interact with another card or device (e.g., a larger transaction card, small transaction card, reduced size transaction card, foldable transaction card, the card being part of another device, the card being removed from another device). Moreover, the metal-containing transaction card may have a magnetic stripe, an embedded microchip, a signature panel, a holographic image, and/or any feature typically contained on or within a transaction card. Various foldable cards and/or transaction cards of non-traditional size may be found in the below U.S. Patent documents, all of which are herein incorporated by reference in their entirety: U.S. patent application Ser. No. 10/906,731 filed on Mar. 3, 2005 and entitled System and Method for Non-Traditionally-Sized RF Transaction Card, U.S. patent application Ser. No. 10/906,732 filed on Mar. 3, 2005 and entitled Foldable Non-Traditionally-Sized RF Transaction Card System and Method, which issued as U.S. Pat. No. 7,156,301 on Jan. 2, 2007, U.S. patent application Ser. No. 10/436,343 filed on May 12, 2003 and entitled Compact or Convenient Transaction Cards, which issued as U.S. Pat. No. 7,124,955 on Oct. 24, 2006, and U.S. patent application Ser. No. 10/733,619 filed on Dec. 10, 2003 and entitled Foldable Transaction Card Systems, which issued as U.S. Pat. No. 7,147,151 on Dec. 12, 2006.

A metallic card body may refer to a material in any shape or thickness. The metallic card body may be shaped substantially as a transaction card and/or a layer of a transaction card. In that regard, the card body may be generally sized as a transaction card though it may not meet ISO 7810 and/or 7811 dimensions. A layer of a transaction card may refer to a material that has the length and width (as defined herein) substantially near the ISO 7810 and/or 7811 specified dimensions but has a thickness (as defined herein) less than the ISO 7810 and/or 7811 specified dimensions. In that regard, a metallic card body may comprise a layer of metal that is, in various embodiments, bonded, laminated and/or otherwise coupled to a layer of a ceramic material. In various embodiments, a metallic card body may have the width and height of an ID-1 card as set forth in ISO 7810 and ISO 7811, but may have a thickness that is less than the thickness of an ID-1 card as set forth in ISO 7810 and ISO 7811. For example, a metallic card body may have a thickness of less than 0.03 in. and/or less than 0.025 in.

In various embodiments, a fill panel may comprise a ceramic material. A ceramic material may comprise any suitable ceramic as well as any suitable binder, dopant, or other adjunct (e.g. a dye) that may impart one or more physical characteristics to the ceramic. A ceramic material may comprise zirconium dioxide (zirconia), silicon carbide, boron carbide, or the like. Suitable dopants include yttria ($Y_2O_3$), calcium oxide, aluminum oxide, silicon dioxide, and other rare earth metals and their oxides. Suitable binders may include sodium silicate, magnesium aluminum silicates, polyvinyl alcohol, starches, carboxymethylcellulose, dextrin, and various the like. Various dyes may be used to alter the color of any portion or all of the card body.

In various embodiments, a fill panel may comprise a monolithic ceramic. A monolithic ceramic may be a ceramic material that is formed (e.g., fired or sintered) without the use of reinforcing fibers. In that regard, a monolithic ceramic is fired and/or sintered as one component. However, in various embodiments, a fill panel may comprise a fiber reinforced ceramic. As used herein, a "fiber reinforced ceramic" may comprise any fiber material that is reinforced with a ceramic material. For example, a carbon fiber-reinforced polymer may comprise carbon fiber reinforced with a ceramic material. In that regard, a fiber reinforced ceramic may include a fibrous material such as carbon fibers, aramid fibers, fiberglass fibers, or similar fibers reinforced with a ceramic material, such zirconia and/or silicon carbide. Fibrous reinforced polymers tend to have a high strength to weight ratio, typically allowing for a stiff component to be produced with relatively light weight.

Ceramic materials that have undergone firing and/or sintering (i.e., fired ceramic materials) may be subject to grinding. In that regard, any suitable abrasive may be used to grind a fired ceramic material. For example, a grinding wheel, grinding belt, or abrasive powder may be used to grind a fired ceramic material. Grinding may proceed under dry conditions or wet conditions.

Fired ceramic materials may be subject to polishing, for example, after grinding. In that regard, any suitable polishing and/or buffing technique may be used to polish a fired ceramic material. For example, a polishing cloth or other textile may be used, with or without polishing aids such as polishing wax or polishing paste, may be applied to a fired ceramic materials. Buffing may be performed with commercially available buffing equipment. Polishing and/or buffing may cause a fired ceramic material to have a glossy and/or highly reflective finish.

In various embodiments, as described herein, a fill panel may comprise a fired ceramic material. The fill panel may be polished and/or buffed to a glossy, highly reflective finish. In various embodiments, one or more lasers may be used to alter the fill panel. A laser may emit a focused beam of light having a given power output. Thus, a laser directed at a surface may have varying effects on the surface based upon the power output of the laser and the duration of exposure. Lasers may emit a light over a small area, providing the ability for precision works. Moreover, lasers may be accurately and precisely controlled via electronic control systems for manufacturing ease. A typical laser may be obtained from Virtek Laser Solutions, Inc. In various embodiments, a 1064 nm, 25 W diode pumped $YVO_4$ laser may be used.

The effect a laser may have on a ceramic material depends in part on the power output of the laser and the duration of exposure. For example, exposure for a short time to a low power laser may alter the surface characteristics of a ceramic material, for example, changing a glossy finished surface to a matte finish (i.e., one that is not as reflective to visible light). In contrast, exposure to a high power output laser for a first duration, or a lower power output laser for a second duration that is longer than the first duration, may cause a perforation of the ceramic material. In that regard, various laser processes may be characterized by their effect on a ceramic material. These various techniques may be applied, in various embodiments, in the manufacture of a transaction card. Lasers can provide a marking of ceramic materials at depths of as low as about 0.0003 inches. Though lasers may have various power outputs, for purposes of explanation, various laser processes may be characterized by the total power during the exposure to a ceramic material. Stated another way, the total power of laser exposure to a surface may be thought of as the amount of laser energy applied per unit time of exposure.

As used herein, "laser finishing" may refer to application of a laser to a ceramic material (e.g., a fill panel comprising a ceramic material) to remove and/or disrupt a glossy and/or highly reflective finish. In that regard, laser finishing may impart a matte finish on a ceramic material surface.

As used herein, "laser marking" may refer to application of a laser to a ceramic material (e.g., a fill panel comprising a ceramic material) to impart a visible disruption to the ceramic material surface. For example, laser marking may remove a portion of ceramic material from a ceramic material surface. In that regard, laser marking may impart visible features to a ceramic material surface. For example, laser marking may be used to impart readable text onto a ceramic material surface. In various embodiments, account indicia such as an account number, an accountholder's name, a loyalty notation (e.g., "Member Since 2001"), an expiration date, a signature, a brand name, or other indicia such as legal notices, regulatory compliance messages, phone numbers, URLs, email addresses, trademarks, pictures, graphics, bar codes, CCID code or any alphanumeric characters may be laser marked onto a ceramic material surface. Laser marking involves the application of more total power from a laser than laser finishing.

As used herein, "laser etch" may refer to application of a laser to a ceramic material (e.g., a fill panel comprising a ceramic material) to impart an indentation to the ceramic material surface. For example, laser etching may remove a portion of ceramic material from a ceramic material surface. In that regard, laser marking may impart visible features to a ceramic material surface that have a palpable depth. For example, laser etching may be used to impart various graphic features onto a ceramic material surface. In various embodiments, a logo, a decorative border, a brand name, and/or other features may be laser etched onto a ceramic material surface. Laser etching involves the application of more total power from a laser than laser marking.

In various embodiments, a metallic card body may comprise a metallic material. A metallic material may comprise any suitable metal and/or metal alloy, including titanium, titanium alloy, aluminum, aluminum alloy stainless steel, tin, zinc, copper, nickel, chromium, and/or nickel/chromium alloys.

In various embodiments, a metallic card body may be coated with a protective coating. The coating may be deposited via physical vapor deposition (PVD). In various embodiments, the body may be coated with a protective coating such as a diamond like carbon (DLC) coating. A DLC coating may be generally amorphous, though portions of a DLC coating may have a crystalline structure. For example, a DLC coating may comprise a mixture of forms of carbon, including graphite and diamond. In that regard, carbon in a DLC coating may contain hybridized carbon. A DLC coating may comprise a carbon composition that exhibits high hardness, corrosion resistance, low coefficient of friction (~0.02 to 0.2), and high electrical resistivity. A DLC coating may be between 1 micron and 50 microns thick, between 2 microns and 25 microns thick, and between 2 microns and 15 microns thick. A DLC coating may be applied by PVD process, for example, cathodic arc PVD, sputtering, or plasma assisted chemical vapor deposition (CVD).

In various embodiments, a metal-containing transaction card having a metallic card body and a DLC coating may provide improved corrosion resistance relative to metallic transaction cards without a DLC coating.

Figure 2:
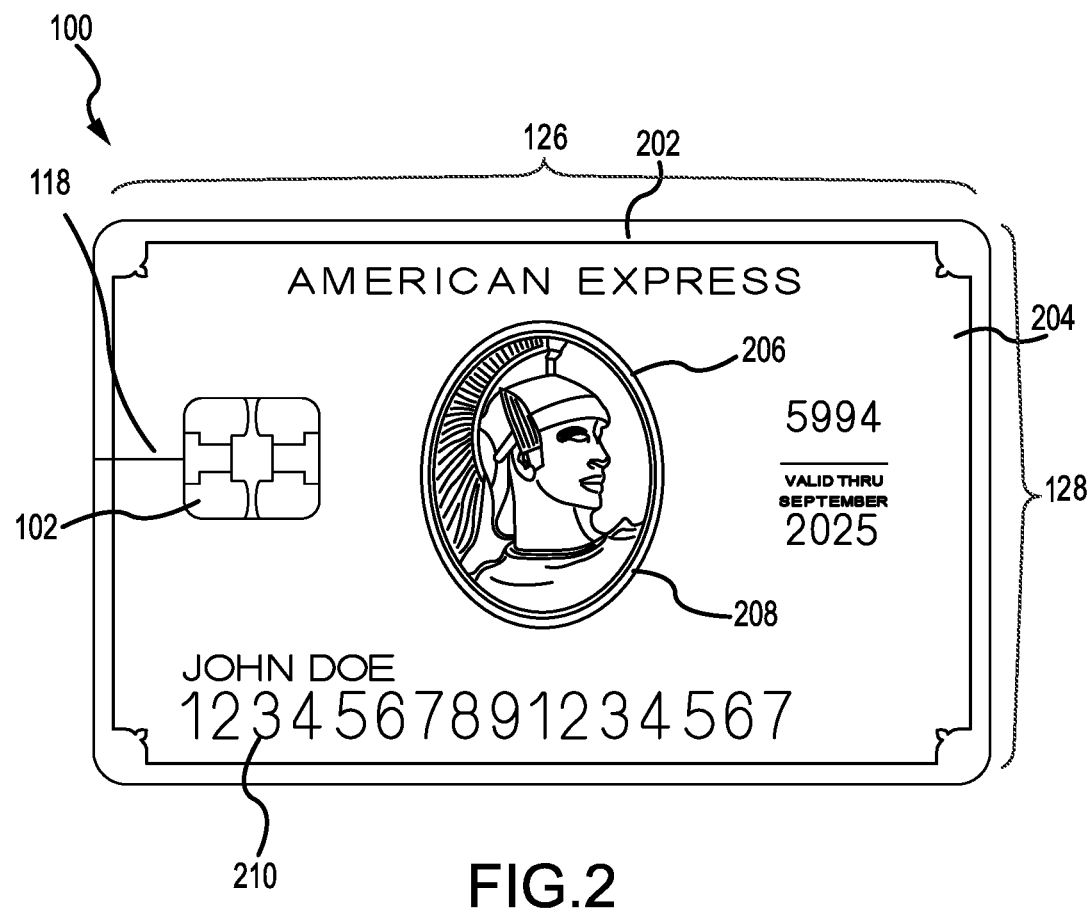
FIG. 2 illustrates a view of a primary surface of a metal-containing transaction card having a DLC coating, in accordance with various embodiments.
Figure 3:
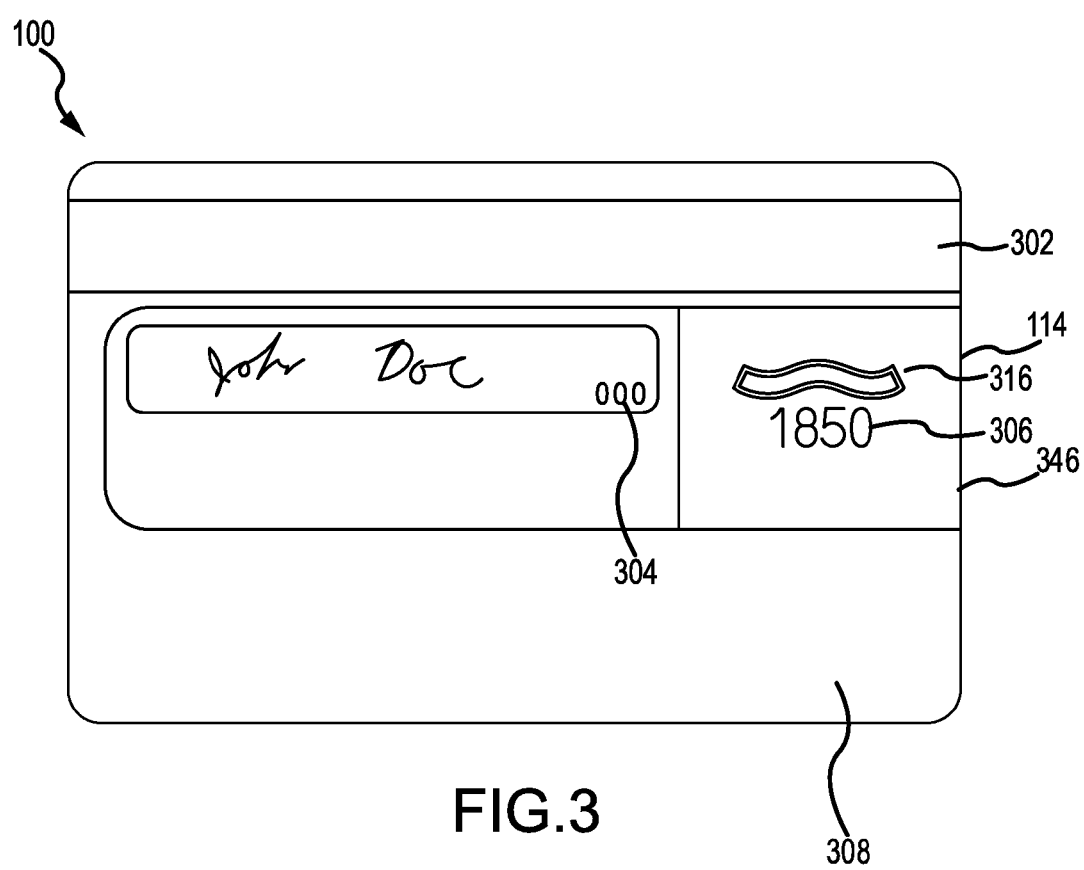
FIG. 3 illustrates a view of a secondary surface of a metal-containing transaction card a DLC coating, in accordance with various embodiments.

Referring now to the drawings, FIGS. 1, 2 and 3 illustrate a metal-containing transaction card 100 showing primary surface 204. The metal-containing transaction card 100 may be composed of card body 110 which comprises a metallic material. Width 126 is shown relative to height 128. Card body 110 has thickness 104, which may be 0.03 in. Primary surface 204 and secondary surface 308 have a DLC coating and various features that are produced through laser marking, laser finishing, laser etching, and laser perforation, as described herein.

Primary surface 204 may comprise one or more of a matte surface and a glossy surface. In various embodiments, primary surface 204 may be polished to a glossy, highly reflective surface. Laser finishing may be used to transform a portion of the glossy surface to a matte finish.

Metal-containing transaction card 100 may comprise pocket 122. Pocket 122 may comprise an indentation or other depression that is offset from primary surface 204. Microchip 102 is disposed in pocket 122. The position of microchip 102 on the metal-containing transaction card 100 may be standardized by industry practice (for example, ISO 7816). Microchip 102 may include an integrated antenna so that microchip 102 may facilitate wireless transactions. Microchip 102 may comprise any suitable recordable media, for example, an integrated circuit. Microchip 102 may comply with one or more industry standards such as ISO 7819 and ISO 7816 to provide "smartcard" functionality to metal-containing transaction card 100. In that regard, microchip 102 may aid in the facilitation of financial transactions.

Many jurisdictions may now prefer a microchip in transaction cards. Microchip 102 may be disposed onto a card body in a variety of ways. Pocket 122 may be formed so that when microchip 102 is disposed therein, a surface of microchip 102 will be flush or substantially flush with primary surface 204. An adhesive may be disposed in the pocket 122 or on the microchip 102 prior to positioning a microchip 102 into a pocket 122 in metal-containing transaction card 100. Any suitable adhesive may be used. For example, ABLEBOND 931-1T1N1 may be used for this purpose. Further, in various embodiments, an insulating material may be disposed in the card body pocket to be positioned between the microchip and the card body so as to electrically insulate the microchip and the card body. An adhesive may act as an insulating material. Any insulator may be used for this purpose.

Laser marked feature 210 is disposed on primary surface 204. Laser marked feature may be produced by laser marking, as discussed above. In various embodiments, laser marked feature may include account indicia such as an account number, an accountholder's name, a loyalty notation (e.g., "Member Since 2001"), an expiration date, a signature, a brand name, or other indicia such as legal notices, regulatory compliance messages, phone numbers, URLs, email addresses, trademarks, pictures, graphics, bar codes, CCID code or any alphanumeric characters.

Laser etched feature 202 is disposed on primary surface 204. Laser etched feature may be produced by laser etching, as discussed above. In various embodiments, laser etched feature may include a logo, and/or a decorative feature such as a border, though other patterns are contemplated herein.

Secondary surface 308 may comprise fill panel 114. Fill panel 114 may comprise a ceramic material, for example, at least one of zirconium oxide, zirconium dioxide, boron carbide, or silicon carbide. Fill panel 114 may have thickness 108. Thickness 108 may be from about 0.5 mil to 10 mil, 1 mil to 8 mil and 2 mil to 5 mil, wherein the term about in this context only means+/−0.25 mil. Fill panel 114 may be coupled to card body 110 by an adhesive or other suitable coupling method. Fill panel 114 may be set into shallow pocket 346. Shallow pocket 346 may be machined, milled, or otherwise disposed in secondary surface 308 so that a surface of fill panel 114 is flush with secondary surface 308. Stated another way, shallow pocket 346 may have the same thickness as thickness 108.

Fill panel 114 may comprise a gloss/matte feature. A gloss/matte feature may comprise a feature that comprises a gloss portion 306 and matte portion 316. Together, gloss portion 306 and matte portion 316 may be configured to display account indicia such as an account number, an accountholder's name, a loyalty notation (e.g., "Member Since 2001"), an expiration date, a signature, a brand name, or other indicia such as legal notices, regulatory compliance messages, phone numbers, URLs, email addresses, trademarks, pictures, graphics, bar codes, CCID code or any alphanumeric characters. In that regard, alphanumeric characters may be formed as gloss portion 306 against background of matte portion 316.

Magnetic stripe 302 may be disposed on secondary surface 308. Magnetic stripe 302 may comprise any suitable recordable media. Magnetic stripe 302 may be encoded via any encoding processes commonly used to encode the transaction cards. Specifically, either or both of the recordable media, such as the magnetic stripe and/or the microchip, may be encoded to provide metal-containing transaction card 100 with information beneficial to facilitate a financial transaction. The recordable media may be read via a magnetic stripe reader or a microchip reader.

Secondary surface 308 may comprise laser marked feature 304. Laser marked feature 304 may comprise marked feature may include account indicia such as an account number, an accountholder's name, a loyalty notation (e.g., "Member Since 2001"), an expiration date, a signature, a brand name, or other indicia such as legal notices, regulatory compliance messages, phone numbers, URLs, email addresses, trademarks, pictures, graphics, bar codes, CCID code or any alphanumeric characters.

Card body 110 may comprise any suitable metal and/or metal alloy, including titanium, titanium alloy, aluminum, aluminum alloy stainless steel, tin, zinc, copper, nickel, chromium, and nickel/chromium alloys. Card body 110 includes aperture 120. Aperture 120 is disposed within pocket 122. Slit 118 extends from the aperture 120 to exterior edge 168 of the card body 110. Slit 118 may pass through the entire thickness of card body 110, though in various embodiments slit 118 may be a score or channel. Slit 118 may aid in distribution of RF signals from microchip 102 through card body 110.

Figure 4:
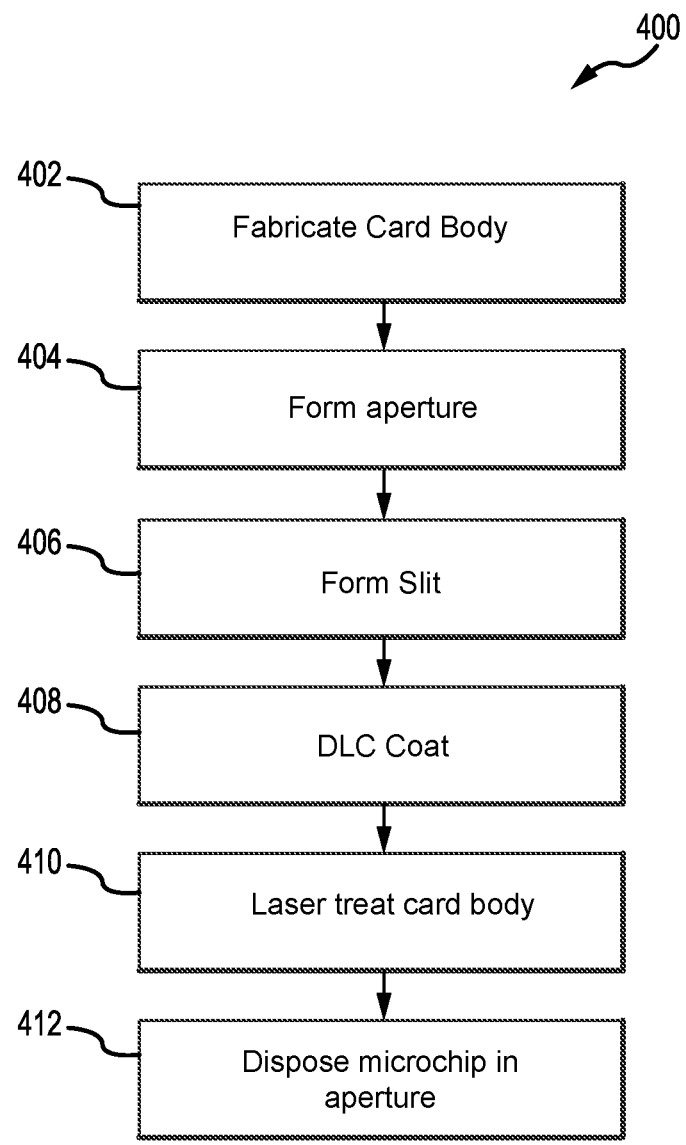
FIG. 4 illustrates a method of making a DLC coated transaction card, in accordance with various embodiments.

With reference to FIG. 4, method 400 is shown of manufacturing a metal-containing transaction card, such as metal-containing transaction card 100. The metallic card body may be fabricated in step 402. Fabrication may include machining, grinding, casting, forging, water jet cutting, die cutting, laser cutting, plasma cutting and stamping, as well as by additive manufacturing techniques. An aperture such as aperture 120 may be formed in step 404. Slit 118 may be formed in the metallic card body in step 406.

The metallic card body may be subject to DLC coating in step 408. A DLC coating may be applied by a PVD process, for example, cathodic arc PVD, sputtering, or plasma assisted chemical vapor deposition (CVD). The DLC coating may be applied to primary surface 204, secondary surface 308 or both.

The metallic card body may be subject to laser treating in step 410. As discussed above, laser treating may comprise laser finishing, laser marking, laser etching, and laser perforation. In that regard, laser finishing, laser marking, laser etching, and laser perforation may be performed on the DLC coated metallic card body to create the various features described in connection with those techniques. In various embodiments, a single laser is used for laser treating and set to different total power outputs to accomplish each task. Certain indicia, such as a cardholder's signature, may be captured digitally and used as a digital template to guide the laser in laser marking the cardholder's signature. The DLC coated metallic card body may have recordable media applied such as a magnetic stripe. A magnetic stripe may be disposed on the DLC coated metallic card body using an adhesive or other suitable coupling media. A microchip may be installed in pocket 122 in step 412.

Metal-containing transaction cards that are DLC coated have a number of advantages over conventional transaction cards comprised of plastic or metal. DLC coatings may be very hard and thus DLC coated metal-containing transaction cards may resist scratching. DLC coated metal-containing transaction cards may be more resistant to deformation than plastic or metal. Combinations of various features found in DLC coated metal-containing transaction cards described herein may be very difficult to reproduce without costly equipment and know-how. Thus, the risk of fraudulent reproduction of DLC coated metal-containing transaction cards is reduced, thus leading to more security. DLC coated metal-containing transaction cards may further provide a luxurious look and feel, which may be beneficial in the marketplace.

In various embodiments, card and related systems may be configured with a biometric security system that may be used for providing biometrics as a secondary form of identification. The biometric security system may include a transponder and a reader communicating with the system. The biometric security system also may include a biometric sensor that detects biometric samples and a device for verifying biometric samples. The biometric security system may be configured with one or more biometric scanners, processors and/or systems. A biometric system may include one or more technologies, or any portion thereof, such as, for example, recognition of a biometric. As used herein, a biometric may include a user's voice, fingerprint, facial, ear, signature, vascular patterns, DNA sampling, hand geometry, sound, olfactory, keystroke/typing, iris, retinal or any other biometric relating to recognition based upon any body part, function, system, attribute and/or other characteristic, or any portion thereof.

In various embodiments, cards, components, modules, and/or engines of the system may be implemented in association with micro-applications or micro-apps. Micro-apps are typically deployed in the context of a mobile operating system, including for example, a WINDOWS® mobile operating system, an ANDROID® Operating System, APPLE® IOS®, a BLACKBERRY® operating system and the like. The micro-app may be configured to leverage the resources of the larger operating system and associated hardware via a set of predetermined rules which govern the operations of various operating systems and hardware resources. For example, where a micro-app desires to communicate with a device or network other than the mobile device or mobile operating system, the micro-app may leverage the communication protocol of the operating system and associated device hardware under the predetermined rules of the mobile operating system. Moreover, where the micro-app desires an input from a user, the micro-app may be configured to request a response from the operating system which monitors various hardware components and then communicates a detected input from the hardware to the micro-app.

As used herein, any terms similar to "identifier" may be any suitable identifier that uniquely identifies an item. For example, the identifier may be a globally unique identifier ("GUID"). The GUID may be an identifier created and/or implemented under the universally unique identifier standard. Moreover, the GUID may be stored as 128-bit value that can be displayed as 32 hexadecimal digits. The identifier may also include a major number, and a minor number. The major number and minor number may each be 16 bit integers.

The card or associated systems may include or interface with any accounts, devices, and/or a transponder and reader (e.g. RFID reader) in RF communication with the transponder (which may include a fob), or communications between an initiator and a target enabled by near field communications (NFC). Typical devices may include, for example, a key ring, tag, card, cell phone, wristwatch or any such form capable of being presented for interrogation. Moreover, the card, system, computing unit or device discussed herein may include a "pervasive computing device," which may include a traditionally non-computerized device that is embedded with a computing unit. Examples may include watches, Internet enabled kitchen appliances, restaurant tables embedded with RF readers, wallets or purses with imbedded transponders, etc. Furthermore, a device or financial transaction instrument may have electronic and communications functionality enabled. For example, by: a network of electronic circuitry that is printed or otherwise incorporated onto or within the transaction instrument (and typically referred to as a "smart card"); a fob having a transponder and an RFID reader; and/or near field communication (NFC) technologies. For more information regarding NFC, refer to the following specifications all of which are incorporated by reference herein: ISO/IEC 18092/ECMA-340, Near Field Communication Interface and Protocol-1 (NFCIP-1); ISO/IEC 21481/ECMA-352, Near Field Communication Interface and Protocol-2 (NFCIP-2); and EMV 4.2 available at http://www.emvco.com/default.aspx.

It should be noted that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to 'at least one of A, B, and C' is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Although the invention has been described as a method, it is contemplated that it may be embodied as computer program instructions on a tangible computer-readable carrier, such as a magnetic or optical memory or a magnetic or optical disk. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A transaction card comprising:
a card body comprising a metallic material, the card body including a primary surface, a secondary surface, an aperture and a slit,
wherein the primary surface and the secondary surface are coated with a diamond like carbon (DLC) coating,
wherein the card body comprises a shallow pocket on the secondary surface, the shallow pocket encompassing the aperture,
wherein the slit extends from the aperture to an exterior edge of the card body, and
a fill panel disposed in the shallow pocket, wherein the fill panel comprises at least one of zirconium oxide, zirconium dioxide, boron carbide, or silicon carbide.

2. The transaction card of claim 1, further comprising a pocket disposed in the primary surface and an integrated RF module disposed in the pocket, a surface of the integrated RF module being flush with the primary surface.

3. The transaction card of claim 1, wherein the card body has a thickness of 0.03 in.

4. The transaction card of claim 1, wherein the metallic material comprises at least one of titanium, aluminum, or stainless steel.

5. The transaction card of claim 1, further comprising a laser marked feature on the DLC coating disposed on the primary surface and comprising at least one of an account number, a name, or a loyalty notation.

6. The transaction card of claim 5, wherein the DLC coating is applied by at least one of cathodic arc physical vapor deposition, sputtering, or plasma assisted chemical vapor deposition (CVD).

7. The transaction card of claim 1, wherein the fill panel is disposed flush with the secondary surface.

8. A method of making a transaction card comprising:
fabricating a metallic card body;
forming an aperture on a primary surface of the metallic card body;
forming a slit in the metallic card body;
forming a shallow pocket in a secondary surface, the shallow pocket encompassing the aperture;
disposing the fill panel in the shallow pocket, wherein the fill panel comprises at least one of zirconium oxide, zirconium dioxide, boron carbide, or silicon carbide; and
coating the metallic card body with a diamond like carbon (DLC) coating.

9. The method of claim 8, further comprising laser marking the metallic card body.

10. The method of claim 8, further comprising forming a pocket in the primary surface.

11. The method of claim 10, further comprising disposing an integrated RF module into the pocket.

12. The method of claim 11, wherein the slit extends from the aperture to an exterior edge of the metallic card body.

13. The method of claim 12, wherein the coating comprises at least one of cathodic arc physical vapor deposition, sputtering, or plasma assisted chemical vapor deposition (CVD).

14. The method of claim 11, further comprising laser etching the primary surface.

15. The method of claim 8, further comprising forming the fill panel.

16. The method of claim 15, wherein the disposing the fill panel in the shallow pocket comprises making the fill panel flush with the secondary surface.

* * * * *